United States Patent [19]

Adams et al.

[11] 4,316,060
[45] Feb. 16, 1982

[54] EQUALIZING SYSTEM

[75] Inventors: Robert W. Adams, Medford; Leslie B. Tyler, Newtonville, both of Mass.

[73] Assignee: DBX, Inc., Newton, Mass.

[21] Appl. No.: 109,487

[22] Filed: Jan. 4, 1980

[51] Int. Cl.³ .............................................. H03J 5/24
[52] U.S. Cl. ............................................... 179/1 D
[58] Field of Search ................... 179/1 D, 1 FS, 1 P, 179/1 AT; 333/28 R, 28 T; 328/138, 167

[56] References Cited

U.S. PATENT DOCUMENTS

| | | | |
|---|---|---|---|
| 3,624,298 | 11/1971 | Davis et al. | 179/1 D |
| 3,732,370 | 5/1973 | Sacks | 179/1 D |
| 4,088,834 | 5/1978 | Thurmond | 179/1 FS |
| 4,088,835 | 5/1978 | Thurmond et al. | 179/1 FS |
| 4,118,601 | 10/1979 | Yeap | 179/1 D |

Primary Examiner—Bernard Konick
Assistant Examiner—J. A. Popek
Attorney, Agent, or Firm—Schiller & Pandiscio

[57] ABSTRACT

An improved equalizing system for modifying an input electrical signal representative of original sound so as to correct for the inherent nonflat frequency response of an audio signal processing apparatus and the acoustic effects of listening environment in which the loudspeaker system of the audio signal processing apparatus may be disposed. The improved equalizing system includes a comparator for comparing the signal energy in each of a plurality of select frequency bands of a predetermined frequency range of the input signal with that of the corresponding signal energy in a like plurality of bands of a like range of a second signal representative of the acoustic output of the loudspeaker system and as a function of the nonflat frequency response and the acoustic effects of the environment. A correction signal representative of the comparison is used to modify the energy within each band of the input signal so as to substantially correct for the nonflat response and the acoustic effects of the environment. In the preferred embodiment, a unique filter arrangement is provided for simultaneously reducing the interaction between adjacent bands and the amount of ripple at the output of the equalizing system.

25 Claims, 7 Drawing Figures

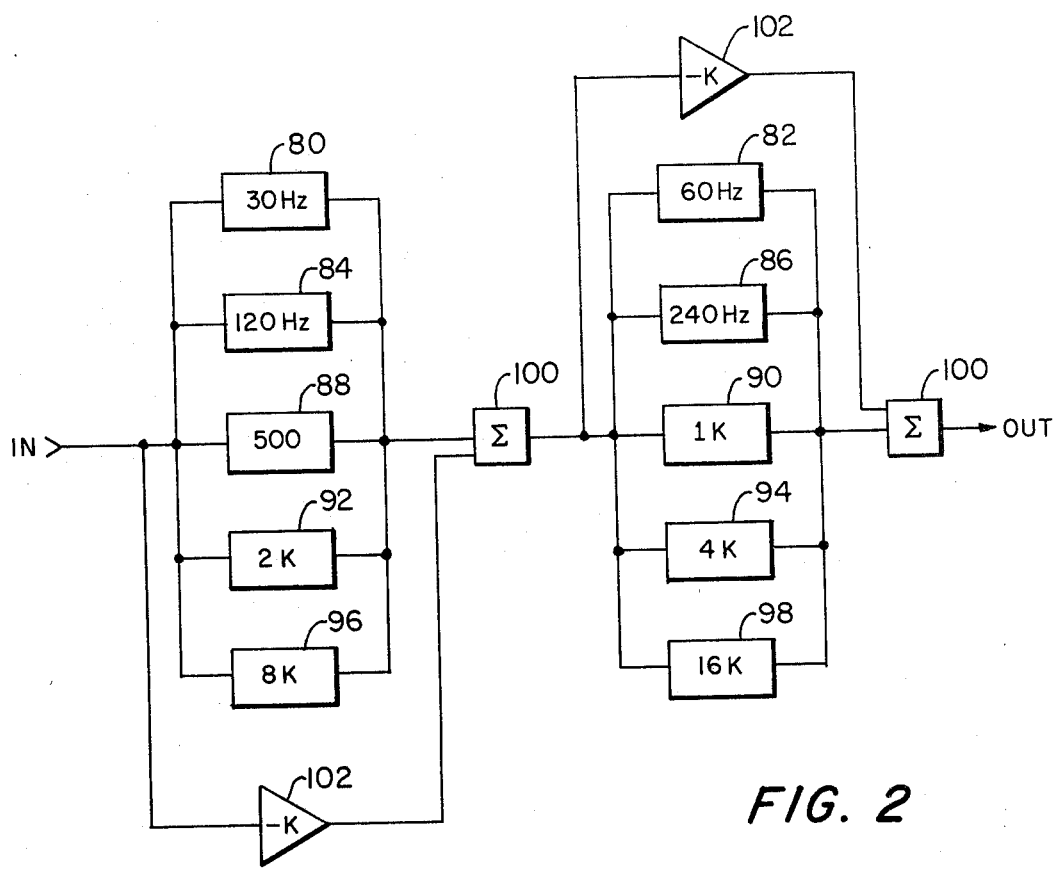
FIG. 2
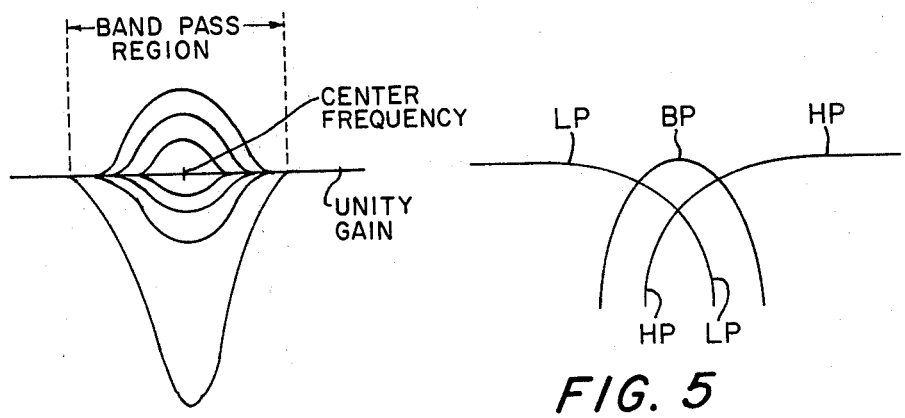
FIG. 3
FIG. 5

EQUALIZING SYSTEM

The present invention relates generally to audio signal processing apparatus and more particularly to an automatic equalizing system for use in such signal processing apparatus for correcting for the inherent nonflat or nonlinear frequency response of such apparatus and acoustical effects of the listening environments in which they may be disposed.

An equalizing system is generally useful in any audio signal system, such as a tape recorder, record player, or a radio receiver because it allows the listener to overcome the inherent nonflat frequency response to audio signal system and the acoustical effects of the listening environment. In particular, one or more frequency portions of the signals which pass from the output of a power amplifier of an audio signal reproduction apparatus to the speaker system where the sound is reproduced within the listening room, are relatively enhanced or attenuated according to the frequency characteristics of the speaker system and listening room. The enhancement and attenuation of these frequency portions of these signals results in a loss of fidelity since the sounds heard by the listener are no longer a close approximation to the originally recorded or transmitted sounds. The loss of fidelity can be largely overcome by coupling an equalizing system typically between the preamplifier and the power amplifier of an audio signal processing apparatus.

A common type of commercially available equalizing system is generally referred to as the "graphic equalizer". The graphic equalizer allows for manual adjustment of each of a plurality of frequency bands. In particular each frequency band is boosted or attenuated in order to achieve the desired frequency response.

The manually adjustable equalizing system is disadvantageous since it relies on the user's subjective determination as to what is the desired frequency response. In particular human interaction is required in the equalization process.

In addition to the foregoing other problems have been encountered in the use of equalizing systems. For example, the typical prior art equalizing system separates the signal being processed into a plurality of gain controlled or weighted frequency bands. By making the upper frequency of one band above and very close to the lower frequency of the adjacent higher band (i.e., providing a very narrow overlapping of bands), a ripple may be produced between each band in the output of the equalizing system. Increasing the overlapping between adjacent bands result in reducing the amount of ripple but also reduces the amount of equalizing control, since an attempt to enhance or attenuate the signal energy in a particular band will be underminded by the fact that some of that signal energy will be unaffected since it is included in an adjacent band. The above problems have manifested itself in two prior art approaches. One approach is to provide equalization through parallel signal paths, each for a respective frequency band. Although reducing the amount of ripple in the output, there is an increase in interaction between adjacent bands. The second approach provides equalization through one signal path comprising series-connected filters. Although this can reduce the amount of interaction, it nevertheless increases the amount of ripple between bands.

It is therefore an object of the present invention to provide an improved equalization system for use with audio signal processing apparatus.

More specifically, an object of the present invention is to provide an automatic closed-loop system for providing equalization in which human interaction is not needed.

Another object of the present invention is to provide an improved equalizing system having reduced ripple in the output with less interaction between adjacent bands.

Still another object of the present invention is to provide an improved equalizing system which compares the original sound and the reproduced sound as a function of the inherent nonflat frequency response of the speaker system and listening environment.

These and other objects of the present invention are achieved by an improved equalizing system for modifying an input electrical signal representative of original sound so as to correct the inherent nonflat frequency response of an audio signal processing apparatus and the acoustical effects of the listening environment in which the loudspeaker system of the audio signal processing apparatus may be disposed. The improved equalizing system includes means for comparing the signal energy in each of a plurality of select frequency bands of a predetermined frequency range of the input signal with that of corresponding energy in a like plurality of bands of a like range of a second signal representative of the acoustic output of the loudspeaker system and as a function of the nonflat frequency response and the acoustic effects of the environment. A correction signal representative of the comparison is used to modify the energy within each band of the input signal so as to substantially correct for the nonflat response and the acoustic effects of the environment. In a preferred embodiment a unique filter arrangement is provided for simultaneously reducing the interaction between adjacent bands and the amount of ripple at the output of the equalizer system.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and the object of the present invention, reference should be had to the following detailed description taken in connection with the accompanying drawings wherein:

FIG. 2 shows a block diagram of the preferred form of the distribution of the filters of the equalizer unit of the FIG. 1 embodiment;

FIG. 3 illustrates in graphical form the preferred frequency response of each filter of FIG. 2;

FIG. 5 illustrates in graphical form the frequency response of the filter of FIG. 4;

In the drawings like numerals are used to denote like parts.

Figure 1:
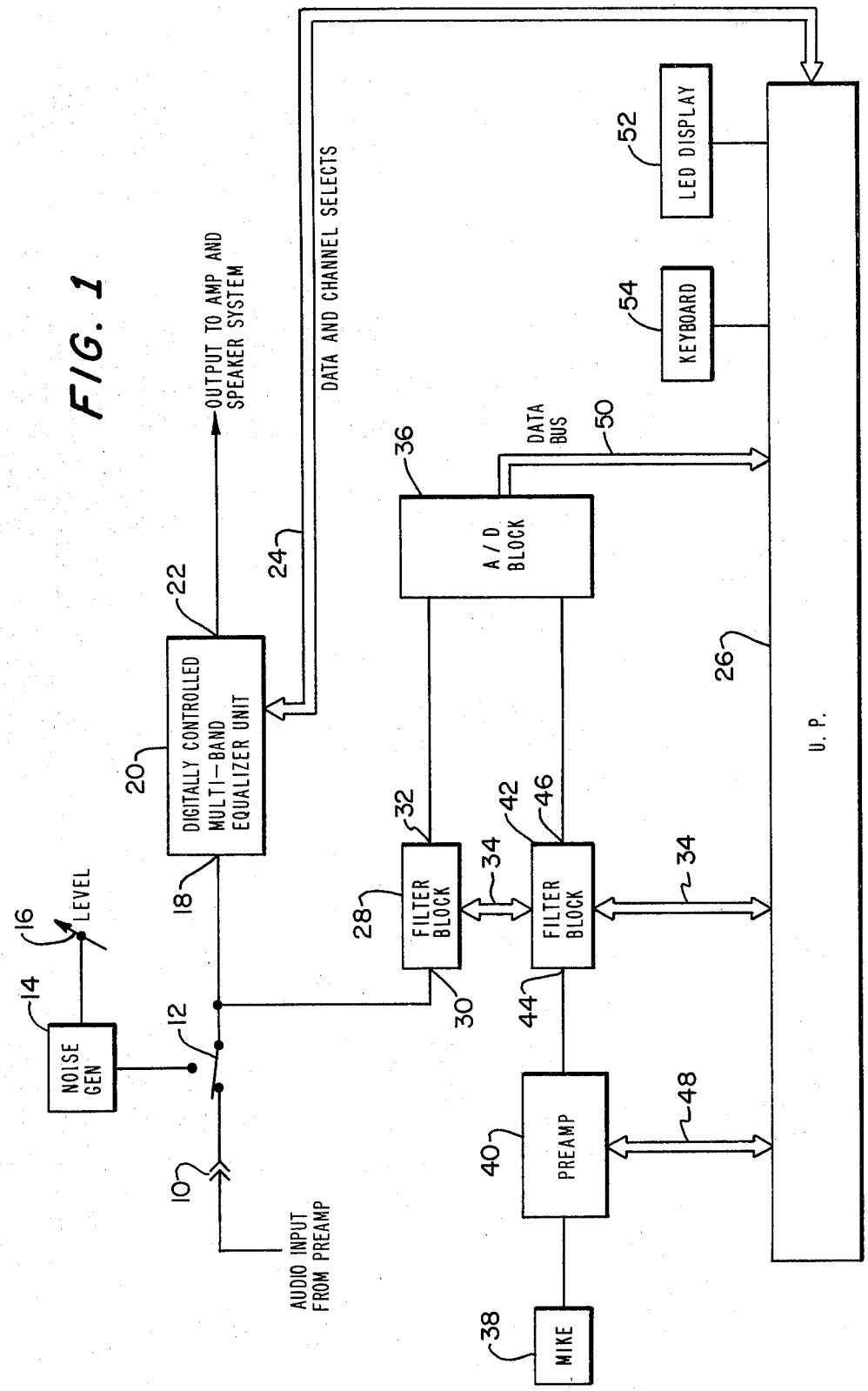
FIG. 1 is a block diagram of the preferred form of the present invention.

Referring to FIG. 1 the preferred equalizing system comprises an input terminal 10 for receiving an audio signal. The audio signal may be any type of program audio signal, whether transmitted or recorded, and preferably, although not necessarily the output of a preamplifier of audio signal processing apparatus. Terminal 10 is connected to one pole of a switch 12. The second pole of switch 12 is connected to the output of noise generator 14 having an amplitude level control 16 so that in one mode switch 12 transmits the audio signal from terminal 10 and in a second mode the switch transmits the noise provided by generator 14. Generator 14 is of a type well known in the art and preferably although not necessarily, provides at its output pink noise within a bandwidth from 20 Hz to 20 KHz at an amplitude level determined by control 16. As is well known, pink noise generally is noise having equal signal energy per frequency octave.

The contact of switch 12 is connected to the input terminal 18 of a digitally controlled multi-band equalizer unit 20, which in turn has its output terminal 22 preferably, although not necessarily, connected to the amplifier (which in turn is connected to the speaker system) of the audio signal processing apparatus. Unit 20 is generally designed to divide the signal at its input terminal 18 into two or more discrete frequency bands. The path defined between input terminal 10 and the output terminal 22 of unit 20 defines the main transmission path of the system. As will be more evident hereinafter the signal energy in each discrete band of the input signal of unit 20 is modified in accordance with a function of a correction signal received over the data and channel selection bus 24 from the information storage and retrieval system 26. The correction signal is a function of the nonflat frequency response of the speaker system and listening environment for that frequency band so that once the equalization process is achieved the unit 20 will modify the signal at its input terminal 18 so that the signal at its output terminal 22 will be such so as to substantially compensate for that nonflat frequency response.

System 26 may be any type of information processing system now commercially available, such as a low cost microprocessor and peripheral circuitry (Read Only Memory, Random Access Memory, etc.) Such a microprocessor is manufactured by Rockwell International Corporation of California under model number 6502. The Read Only Memory may be programmed in accordance with the program attached as Appendix A. It will be appreciated that other systems and programs can be utilized to accomplish the principles and objects of the present invention.

In addition to system 26, the means for providing the correction signal for each frequency band as a function of the nonlinear frequency response of the speaker system and listening environment includes a first filter block 28; means in the form of microphone 38 for providing an electrical signal as a function of the output of the speaker system within the listening environment; a preamplifier 40; a second filter block 42; and means in the form of the analog to digital converter (A/D) block 36 for providing a signal to system 26 as a function of a comparison between the output of blocks 28 and 42.

More particularly, the output of switch 12 is connected to the input terminal 30 of block 28, which in turn has its output terminal 32 connected to one input of block 36. Microphone 38 is connected to preamplifier 40. The gain of preamplifier 40 is preferably controlled over bus 48 by system 26. The output of preamplifier 40 is connected to input terminal 44 of block 42, which in turn has its output terminal 46 connected to the second input of A/D block 36.

Generally, filter block 28 receives the original signal transmitted through switch 12, while filter block 42 receives a signal which has been adjusted by preamplifier 40 so as to provide a similar signal modified by the frequency response of the portions of the signal processing apparatus including the speaker system and listening environment following the unit 20. Both blocks 28 and 42 are adapted to separate the respective signals received at their corresponding input terminals 30 and 42 into the same frequency bands as provided in unit 20 and provide output signals at their respective output terminals 32 and 46 representative of the signal energy contained in each frequency band of the respective input signals. A/D block 36 is adapted to compare the signal output of blocks 28 and 42 for each band and provide a signal over bus 50 to system 26 representative of the comparison for that band. The outputs of each of the blocks 28 and 42 may be simultaneously supplied signals over separate paths, one for each band, and block 36 may simultaneously (1) compare the outputs of blocks 28 and 42 for each of the bands and (2) simultaneously provide an output comparison signal to system 26 for each band. Preferably, however, as will be more apparent hereinafter each band is measured separately with (1) the blocks 28 and 42 providing a sequential output so that the output signal of the blocks at any instant of time is representative of the signal energy in a single band, the particular band being determined by the selection signals received over bus 34 from systems 26, and (2) block 36 being in the form of a comparator which provides a signal representative of the difference between the two received signals. The amount of signal correction for each frequency band can be visually indicated in an LED (light emitting diode) display 52.

The operation of the equalizing system will be more evident from a detailed description of the preferred unit 20, filter blocks 28 and 42 and preamplifier 40.

Preferably, the unit 20 utilizes a plurality of filters connected in a series and parallel combination so as to simultaneously reduce both the amount of interaction between adjacent bands and ripple in the output of unit 20. More particularly, the filters are connected in a manner illustrated in FIG. 2. As shown the filters are preferably designed to pass substantially the same amount of signal energy when switch 12 is set in the mode for generating pink noise from generator 14, i.e. each filter is described hereinafter as defining a discrete frequency band of one octave having its center frequency at the octave center. Alternatively, other bandwidths may be utilized such as a fraction of an octave, one-third octaves providing good results. In accordance with one aspect of the present invention two sets or arrays of parallel filters, each filter defining a discrete frequency band, are connected in series with one another so that any two filters defining adjacent bands are in series with one another. This results in the bands of any two parallel filters being far enough apart so as to provide relatively little interaction between the two while the adjacent bands of any two filters in series with one another are sufficiently close so as to provide little ripple between the bands at the output of unit 20. The number of bands are such that all the signal energy of interest (preferably 20 Hz–20 KHz) is transmitted through the filters. Accordingly, ten filters are shown with five parallel-connected filters 80, 84, 88, 92 and 96 (having their respective center frequencies at 30 Hz, 120 Hz, 500 Hz, 2 KHz and 8 KHz) being connected in series with five other parallel-connected filters 82, 86, 90, 94 and 98 (having their respective center frequencies at 60 Hz, 240 Hz, 1 KHz, 4 KHz and 16 KHz).

Each of the filters of unit 20 is preferably a "peak and dip" filter having variable frequency transmission characteristics such as shown in FIG. 3 within the frequency band of interest.

As shown in FIG. 3 the "peak and dip" type of filter transmits at unity gain signal energy outside the bandpass region and varies or weights the gain within the bandpass region as a function of the control or correction signal provided by system 26 and derived from the output of A/D block 36. Specifically, when the gain is increased above unity gain for the passband the transmission of the filter will "peak" at its center frequency, and when the gain is decreased below unity gain for the passband the transmission of the filter will dip at its center frequency. Each filter accordingly is utilized to make the adjustment in signal energy in response to a correction signal for that frequency band to provide equalization by either peaking (whereby the signal energy in the band is enhanced) or dipping (whereby the signal energy in the band is attenuated).

Since the nature of the peak and dip filters of the filter array of unit 20 is such that each filter provides unity gain transmission of signal energy outside its passband, the signal energy for a particular passband of one filter will be simultaneously transmitted at unity gain through each of the other filters of the same parallel array. It is therefore necessary to subtract from the output of each parallel array of filters the signal energy within each frequency band of each filter of the array times a gain multiple equal to the total number of filters in the array less one. This can be illustrated by the fact that filters 84, 88, 92 and 96 all pass at unity gain the signal energy within the passband of filter 80 since that signal energy is outside the passband of the filters 84, 88, 92 and 96. Accordingly, the output of each parallel filter array is connected to one input of a summing junction 100, while the input of each filter array is connected to the input of an amplifier 102, the latter having its output connected to a second input of summing junction 100. The gain of amplifier 102 is set in a negative sense at a gain multiple K equal to the number of filters in the array less one. Thus, in the preferred embodiment the value of K, i.e., the gain, is set at four so that the summing junction 100 functions to subtract the signal energy within the frequency range defined by the passband of each filter in the parallel filter array and passed by the remaining four filters of the same array. In the illustration, the signal energy within the passband of filter 80 will simultaneously be applied to the input of amplifier 102. The output of amplifier 102 will contain the signal energy within this passband multiplied by a negative four gain multiple. Applying this amplifier output to junction 100 essentially cancels the signal energy within the passband defined by filter 80 and passed at unity gain by each of the filters 84, 88, 92 and 96. It is noted that a similar effect is provided with regard to the other filters and their passbands.

Figure 4:
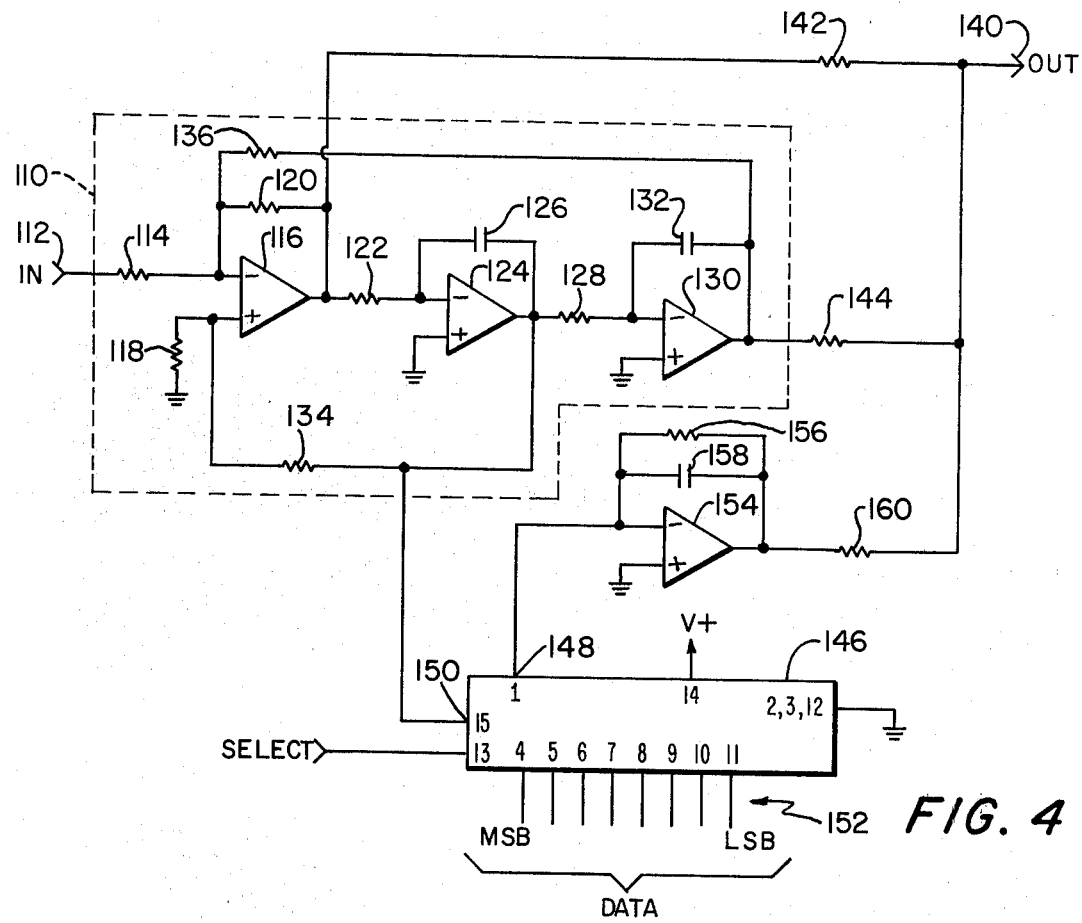
FIG. 4 is a partial schematic and partial block diagram of the preferred filter of the equalizer unit of FIG. 1 having a digitally control gain weighting function within the frequency band of the filter.

Each of the filters is preferably a digitally-controlled gain-weighting bandpass filter of the type shown and described in FIG. 4.

Referring specifically to FIG. 4 the portion of the filter shown within the dotted line 110 is known as a state variable type filter and is generally well known in the art. In particular the input terminal 112 is connected to input resistor 114 which in turn is connected to the inverting input of a first operational amplifier 116. The positive input of amplifier 116 is connected through resistor 118 to system ground, while the output of amplifier 116 is connected to its inverting input through resistor 120. The output of amplifier 116 is also connected through resistor 122 to the inverting input of a second operational amplifier 124, the latter having its positive input connected to system ground. The output of amplifier 124 is connected through feedback capacitor 126 to its inverting input and is connected through resistor 128 to the inverting input of a third operational amplifier 130. The latter has its positive input connected to system ground and its output connected to its inverting input through feedback capacitor 132. The output of amplifier 124 is connected through feedback resistor 134 to the positive input of the first operational amplifier 116, while the output of the third operational amplifier 130 is connected through feedback resistor 136 to the inverting input of the first operational amplifier. As is well known in the art the first operational amplifier 116 functions as a summing amplifier while the second and third operational amplifiers 124 and 130 function as integrators. The output of amplifier 116 will be the highpass output, the output of amplifier 124 will be bandpass, while the output of amplifier 130 will be a lowpass portion of the signal. The particular frequency cutoff of the highpass, bandpass and lowpass output of filter 110 are respectively set by the value of resistors 120 and 136 and the time constants of the integrators 124 and 130. The value of resistors 118, 120, 134 and 136 set the Q of the filter. In accordance with one aspect of the present invention the lowpass and highpass portions of the filter are transmitted at a relative unit gain to the output terminal 140 of the filter. In particular the lowpass output of amplifier 116 is connected through resistor 142 to the output terminal 140 while the highpass output of amplifier 130 is transmitted through resistor 144 to the output terminal 140. The gain of the bandpass output amplifier 124 is preferably digitally controlled by gain control means. Preferably the bandpass output of amplifier 124 is connected to the input terminal 150 of a multiplying digital to analog converter indicated generally at 146, such as chip no. 7524 manufactured by Analog Devices, Inc. a corporation doing business in the Commonwealth of Massachusetts. Converter 146 when enabled by system 26 over bus 34, is generally adapted to provide an output signal at its output terminal 148 which is the product of the analog input at its input terminal 150 multiplied by a value determined by the digital word at its digital input 152 (provided over bus 34 from system 26). The output signal at the output terminal 148 of converter 146 is thus a weighted bandpass portion of the signal within the bandpass region of the filter 110 which varies with the digital word input at terminal 152 of the converter 146. The output terminal of converter 146 is connected to a current-to-voltage converter, which also serves as an inverting amplifier. The particular output terminal 148 of converter 146 is connected to the inverting input of operational amplifier 154, the latter having its positive input connected to system ground and its output connected to its inverting input through each feedback resistor 156 and feedback capacitor 158. The weighted bandpass signal provided at the output of amplifier 154 is transmitted through resistor 160 to the output terminal 140 where it is summed with the unity gain highpass and lowpass signals. The frequency response of the filter of FIG. 4 is best illustrated in FIG. 5 of the drawings. In particular, the lowpass output of amplifier 130 transmitted through resistor 144 to the output terminal 140 is indicated by the curve LP, the highpass output of amplifier 116 transmitted through resistor 142 to the output terminal 140 is indicated by curve HP and the weighted bandpass is indicated generally by the center curve BP. It is noted that depending on the digital input at input terminal 152 of converter 146 the bandpass curve BP will shift up or down thereby changing the gain and thus weighting the bandpass region of the filter. The composite signal thus produced at output terminal 140 and shown in FIG. 5 is of the type shown in FIG. 3.

The digital word input to the digital input 152 of converter 146 is provided by the system 26 over bus 34. System 26 derives the digital word, and therefore the weighting function of the bandpass portion of the filter from the comparison made by the A/D block 36 of FIG. 1. The comparison is separately made for each passband for each filter of unit 20. The comparison for all of the frequency bands may be made simultaneously wherein the output bus 50 from A/D block 36 will provide a plurality of signals representative of the comparison measurements for all of the frequency bands. Alternatively, and preferably the A/D block 36 measures the comparison for the frequency bands, one at a time, in a timed sequence.

Preferably, each filter block 28 and 42 employs a time multiplexing technique whereby the output signals at output terminals 32 and 46 of the respective blocks, respectively represent the signal energy within a particular frequency band of the output of switch 12 and the signal energy provided by microphone 38. Block 36 in this instance can be merely a differential amplifier which in turn provides an output signal which is a function of the difference between the two detected signals.

Figure 6:
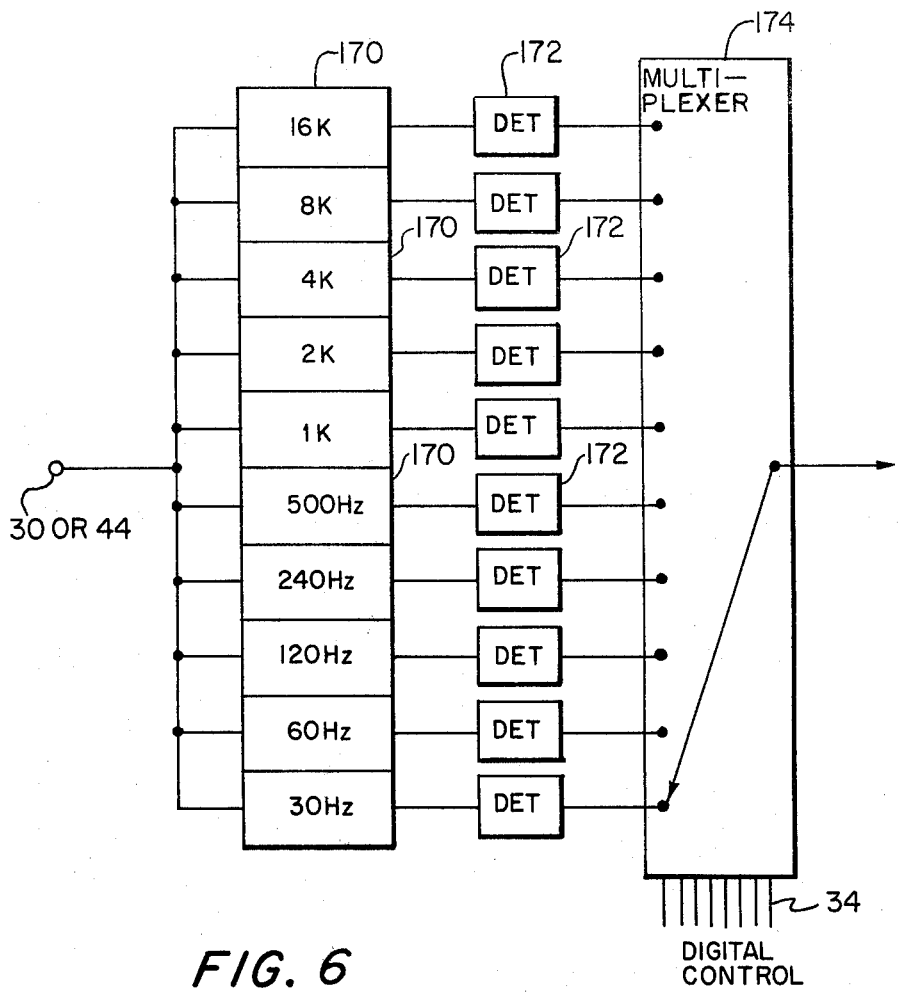
FIG. 6 is the preferred embodiment of the filter block of the embodiment of FIG. 1.

Referring to FIG. 6 the preferred filter block employing the time multiplexing technique is shown. The input terminal of the block is connected to a parallel array of filters 170, the number and the passbands corresponding to the number of filters and passbands of unit 20. Thus, ten filters 170 are preferably employed having center frequencies at 30 Hz, 60 Hz, 120 Hz, 240 Hz, 500 Hz, 1 KHz, 2 KHz, 4 KHz, 8 KHz and 16 KHz corresponding to the bandpass and center frequencies of respectively of filters 80, 82, 84, 86, 88, 90, 92, 94, 96 and 98 all of unit 20. The output of each of the filters 170 is connected to a level detector 172 for providing a DC output as a function of the detected amplitude output of the corresponding filter 170 to which it is connected. Each detector 172 may detect the average level, the peak level, or the RMS level. Preferably, detector 172 is an RMS detector of the type described in U.S. Pat. No. 3,681,618 issued to Blackmer, which detector senses the signal level of the output of each filter on a low ripple or ripple free RMS basis so that the output of detector is linearly related to its input in decibels. The output of each detector 172 is connected to a branch input of multiplexor 174. As well known in the art generally the multiplexor 174 has two types of inputs, branch inputs and address inputs, and a signal output. Only one branch input can be transmitted at any one time through the multiplexor 174 depending on the address provided at the address input over bus 34 from system 26. Thus, by sequencing the address signals for each of the branch inputs, i.e. the outputs of detector 172, the output of multiplexor 174 sequentially provides at its output, the outputs of detectors 172. Referring again to FIG. 1 by providing the same addressing sequence to the multiplexor of both block 28 and block 42, so that the output of block 28 is the signal energy of the same frequency band as that provided by the output of block 42, the A/D block, which is preferably in the form of a comparator, compares the output of each block. Where there is a difference in the signal energy levels to the inputs of block 36, the block 36 will provide an output signal indicating the magnitude and nature of the difference, i.e. the magnitude of the difference as well as which input is greater. The signal output of block 36 is communicated to system 26 which in turn provides the weighting function signal over bus 24 to the appropriate filter of unit 20 so as to modify the weighting function of the bandpass portion of that filter.

The preamplifier 40 preferably is identical to the multiply digital-to-analog converter 146 shown and described with respect to FIG. 4. The output of microphone 38 is provided at the analog input of the converter, and amplified in accordance with a signal gain multiple determined by the digital word input provided by system 26 over the bus 48. Thus, the gain provided by preamplifier 40 is digitally controlled so that the output of the preamplifier and thus the input to filter block 42 is at the approximate amplitude level as that provided at the input of filter block 26.

The operation of the system can be accomplished in one of two modes depending on the position of switch 12. More particularly, by moving the arm of switch 12 so that the output of generator 14 is connected to the switch output, pink noise is simultaneously provided at the input terminal 18 of unit 20 and the input terminal 30 of block 28. Since the nature of pink noise is such that an equal amount of signal energy is provided in each octave, substantially the same amount of signal energy is provided to each of the filters in FIG. 2. For explanatory purposes and not by way of limitation, the bandpass portion of each filter might be thought of as being initially set at unity gain so as to provide no weighting function for any of the frequency bands. The signal energy would therefore be provided at unity gain to the amplifier and speaker system of the audio signal processing apparatus with which the present invention is adapted to be used. The output of the speaker system within the listening environment would be detected by microphone 38 which in turn would provide a signal to the preamplifier 40. Preamplifier 40 adjusts the overall gain of the signal based upon the digital signal provided over bus 48 from system 26. Preamplifier 40 essentially adjusts the gain of the output of mike 38 so that the broadband output of the preamplifier is approximately at the same amplitude level as that provided through switch 12. The signal applied to the input terminal of filter block 42 however, is different from the input signal to filter block 28 due to the nonlinear frequency response of the portion of the processing system connected to the output of unit 20 including the speaker system as well as acoustic effects of the listening environment.

The signal energy in each frequency band is separated by the filter 170 of each block 28 and block 42 into the individual frequency bands of interest. Detectors 172 provide the RMS output to the branch inputs of the multiplexor 174 of each block. The multiplexors 174 of blocks 28 and 42 are addressed by system 26 over bus 34 so that the output of the detector 172 of each frequency band of block 28 is compared by A/D block 36 with the output of detector 172 of the corresponding frequency band of filter 170 of block 42. Thus for example, the RMS level of the signal energy provided within the bandpass region having its octave center at 30 Hz and applied to the input of filter block 28, can be measured by A/D block 36 with respect to the RMS level of the signal energy provided within the same bandpass region and applied to the input of filter block 42 by transmitting the respective bandpass portions through the corresponding multiplexors of blocks 28 and 42 to the block 36. Assuming that there is a difference between signal energies of the two signals applied, block 36 will provide an output signal (indicative of the difference and which input is greater) over bus 50 to the system 26 which in turn provides the digital word to the digital input 152 of converter 146 of the appropriate filter of unit 20. This digital word provides the appropriate weighting function for the bandpass region for that filter which in turn weights the signal energy within the bandpass region transmitted through that particular filter. If there is no difference between the signal energies of the two signals, a unity weighting function is supplied by system 26. Thus in the illustration, the bandpass region having an octave center of 30 Hz in the unit 20 is either enhanced or attenuated depending upon the nature of the difference detected by block 36. This in turn modifies the output to the amplifier and speaker system which in turn modifies the overall frequency response. The equalizing system will then proceed with each frequency band until no differences are detected by block 36 for any of the bands. The equalizing system will then proceed with each frequency band until no differences are detected by block 36 for any of the bands. The equalizing system therefore modifies the frequency response of each region in order to account for the inherent nonlinear frequency response characteristics of the portions of the audio signal processing system including the amplifier and speaker system as well as the listening environment.

It should be appreciated that the same functions can be accomplished by selecting the mode switch 12 so as to transmit the audio input from the preamplifier of an audio reproduction system. Although the signal energy will most likely not be equal within each frequency band, it is noted that for any frequency band the comparison is made regardless of the signal energy in the other bands. Thus the adjustments to the bandpass region for each filter within unit 20 can be successfully accomplished with the audio input.

Figure 7:
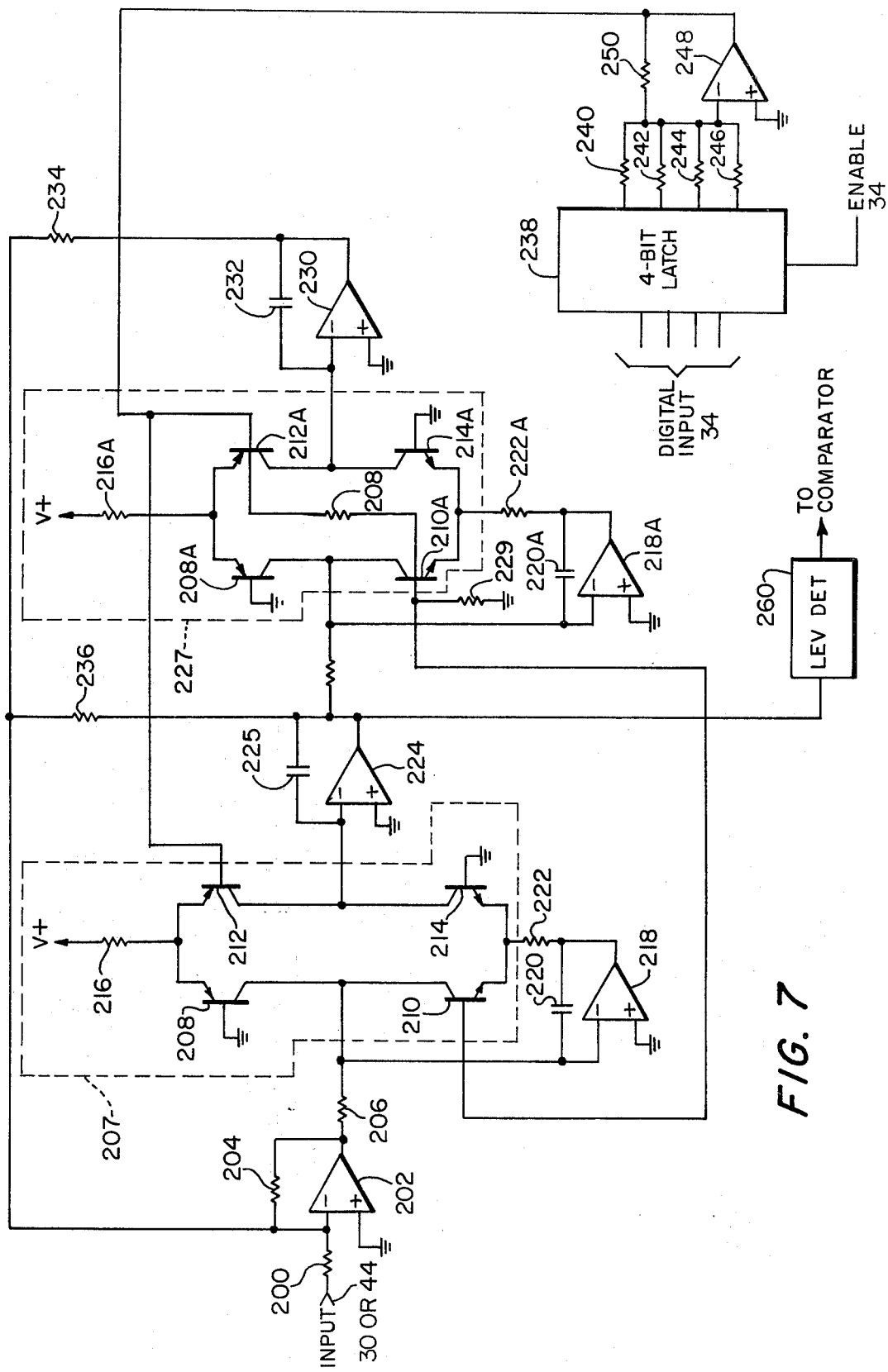
FIG. 7 is an alternative embodiment of the filter block of the embodiment of FIG. 1.

Although the system has been described in its preferred form, it will be noted that certain changes may be made without departing from the scope of the invention. More particularly, the embodiment of FIG. 7 may be substituted for the combination of multiplexing system of FIG. 6 and filter block 28 and 42. In particular, the filter shown in FIG. 7 is a bandpass filter in which the bandpass region can be selected by a digital input. The filter shown is also a state variable filter comprising a summing amplifier 202, integrating amplifier 224 and an integrating amplifier 230. The bandpass region of the output of integrating amplifier 224 is selectively controlled by the digital input from bus 34 to selectively provide the signal energy of the input signal within each frequency band of interest.

More particularly, referring to FIG. 7 the input terminal 30 or 44 of the corresponding block 28 or 42 is connected through resistor 200 to the inverting input of a first operational amplifier 202, the latter having its positive input connected to system ground. The output terminal of amplifier 202 is connected through feedback resistor 204 to its inverting input and is connected through resistor 206 to the input of a signal multiplier circuit in the form of voltage controlled amplifier (VCA) 207. Voltage controlled amplifiers or VCAs are well known in the art. As shown the VCA is of the type shown and described in U.S. Pat. No. 3,714,462 issued to David E. Blackmer on Jan. 30, 1973. Generally, the VCA shown is a signal multiplier circuit in which the input signal is multiplied by a signal gain, the latter being a function of a control signal input. As is well known in the art the input terminal for receiving the input signal is formed by the junction of the collectors of two log converting transistors 208 and 210, one for each polarity of the input signal. The base of transistor 208 is grounded while the base of transistor 210 is connected to receive the control signal input. The emitter of transistor 208 is connected to the emitter of antilog converting transistor 212 and to the biasing resistor 216 which is in turn suitably biased by a positive DC biasing voltage. The base of transistor 212 is connected to receive the control signal input. The emitter of log converting transistor 210 is connected to the emitter of transistor 214, the latter having its base grounded. The input of the VCA is also connected to the inverting input of operational amplifier 218, the positive input of the latter being connected to system ground. The output of amplifier 218 is connected through feedback capacitor 220 to its inverting input and through the resistor 222 to the junction of the emitters of the log converting transistor 210 and the antilog converting transistor 214. The output of the amplifier 207 is connected to the inverting input of the integrating or second operational amplifier 224, which has its positive input connected to system ground. The output of amplifier 224 is connected through feedback capacitor 225 to its inverting input.

The output of integrating amplifier 224 is also connected through resistor 226 to the input terminal of a second voltage control amplifier 227, the latter being identical to the voltage control amplifier 207 except that the base of transistor 212A is connected through resistor 228 to the base of transistor 210A. The output of the second VCA 227 is connected to the inverting input of the integrating or third operational amplifier 230. The positive input of amplifier 230 is connected to system ground while its output is connected through the feedback capacitor 232 to its inverting input. The output of the third operational amplifier 230 is connected through resistor 234 to the inverting input of summing amplifier 202 and similarly the output of the integrating amplifier 224 is connected through resistor 236 to the inverting input of the first operational amplifier 202. As will be more evident hereinafter the control signal applied to the bases of transistors 210 and 212 of VCA 207 and to the bases of transistors 210A and 212A of VCA 227 change the signal gain of the respective VCAs which in turn change in the input impedance and the integrating constant of the integrating amplifiers 224 and 230. This in turn changes the bandpass region of the output of integrating amplifier 224.

The different values of the gain control signal provided to the first and second voltage controlled amplifiers in order to provide the number of passbands are digitally provided by the digital input indicated generally provided over bus 34.

More particularly, where the unit 20 employs ten discrete passbands, a four bit binary input is adequate to provide the ten bandpass filters. The digital input from bus 34 is provided to the input of the four bit latch 238. The four analog output signal levels of latch 238 vary depending on the digital input provided over bus 34 with different output values corresponding to the passbands of unit 20 being provided. The four analog outputs of latch 238 are respectively connected through the four resistors 240, 242, 244 and 246 to the inverting input of operational amplifier 248. The latter has its positive input connected to the ground while the output of the amplifier is connected through feedback resistor 250 to its inverting input. The output of amplifier 248 is also connected to the base of transistor 212 of the VCA 207 and transistor 212A of the second VCA 227. The base of transistor 212A is connected through resistor 228 to the base of transistor 210A. The base of transistor 210A is connected through resistor 229 to system ground and is connected directly to the base of transistor 210.

In operation the digital input is provided to latch 238. An enable signal is provided over bus 34 providing an analog output of the latch as a function of the digital input which in turn is a function of the bandpass region of interest. This analog signal of the output of the latch 238 provides the control signal applied to the first and second VCAs 207 and 227. By varying the control signal level to the VCAs, the input impedance of the integrating amplifiers 224 and 230 are varied so as to vary the bandpass frequency output of the amplifier 224. The output of amplifier 224 is provided to a level detector 260 identical to detector 172 of FIG. 6, which in turn provides an output to the input of the comparator of block 36. Thus, by providing ten digital words to the digital input of latch and enabling the latch, the corresponding signal energy within the ten selected passbands of the input at input terminals 30 or 44 of blocks 28 or 42 can be provided. By selectively providing the same digital input to each block 28 and 42 the signal energy within the selected frequency can be provided by the filters to the two inputs of the A/D block 36.

It should be apparent that positioning microphone 38 in one position in the listening environment will result in the correction for the nonlinear response of the speaker system and listening at that location. However, the nonlinear response for the listening environment will almost always vary from location to location within such environment. Accordingly, the system 26 with the program attached as Appendix A provides the means for averaging the correction signals for several different locations. More particularly, the system 26 can be placed in an average mode through keyboard 54, or in an alternative manner such as a mode switch or the like. The microphone 38 can be positioned in a first location where the correction signal for each frequency band is derived for that location and stored in system 26. The microphone 38 is then placed in a second position, where the correction signal for each frequency bands is derived for the second location and then stored in system 26. The microphone can be placed in third and subsequent locations, the number of locations depending upon the desires of the person utilizing the equalizing system as well as the storing and computing capacity of system 26. The correction signals for each frequency derived from the various locations and stored in system 26 can then be computationally averaged. The computed averaged correction signal for each band can then be transmitted over bus 24 to unit 20 corresponding modifications to the signal transmitted unit 20 made.

It should be appreciated that the same averaging function can be accomplished with a plurality of microphones positioned strategically throughout the listening environment. This might be more desirable where for example the equalizing system is utilized in a large concert hall where the frequency responses may vary at various locations. In such a case the output of each microphone would be connected to a separate preamplifier, similar to preamplifier 40, which in turn would be connected to a separate filter block similar to block 42. The output of each filter block would then be compared with the output of block 28 in the manner described and the signals thus derived, stored and averaged by the system 26. Alternatively, a signal multiplexor, similar to block 174 may be used to time multiplex the several microphones to a single preamplifier and filter block.

The present invention provides an improved equalizing system for use with audio signal processing apparatus. More particularly, the equalizing system provides an automatic closed loop system for providing improved equalization in which human interaction is not necessary. In addition the output of the equalizing system has a reduced ripple in the output with less interaction between the adjacent bands because of the combined parallel-series arrangement of the filters of unit 20 described with respect to FIG. 2. The improved equalizing system allows equalization to be provided by comparing the original sounds and the reproduced sounds as a function of the inherent nonlinear response of the speaker system and the listening environment. This provides a unique advantage since any error in the original signal would be provided in the output of the speaker system; detected by microphone 38 and subsequently cancelled when compared by block 36. Equalization can be achieved with pink noise or a program audio signal.

Since certain other changes may be made in the above apparatus without departing from the scope of the invention herein involved, it is intended that all matter contained in the above description and shown in the accompanying drawings shall be interpreted in an illustrative and not in a limiting sense.

What is claimed is:

1. For use in an audio signal processing apparatus of the type including a loudspeaker system, an equalizing system for modifying an input electrical signal to said loudspeaker system to provide a modified signal corrected for the inherent nonflat frequency response of said loudspeaker system and for acoustic effects of the environment in which said loudspeaker system is disposed, said equalizing system comprising:

input terminal means for receiving said input electrical signal;

output terminal means for coupling the output of said equalizing system to said loudspeaker system;

detection means for detecting the acoustic output of said loudspeaker system generated in response to an input electrical signal applied to said input terminal means of said equalizing system and for generating a first electrical signal representative of said acoustic output of said loudspeaker system and as a function of said nonflat frequency response of said loudspeaker system and the acoustic effects of said environment;

first means for determining the signal energy content of each of a plurality of frequency bands within a predetermined frequency range of said first electrical signal;

second means for determining the signal energy content of each of a like plurality of like frequency bands within a like frequency range of the input electrical signal;

means for comparing the signal energy content of each of said frequency bands of said first electrical signal with the corresponding energy content of the respective like frequency band of said input electrical signal and for generating a correction signal in response to each such comparison; and modification means coupled between said input and output terminal means, and responsive to said correction signals for modifying said input electrical signal within each of the corresponding frequency bands thereof so as to produce said modified signal.

2. An equalizing system in accordance with claim 1, wherein said modification means includes a plurality of filters, each of said filters having a predetermined passband region, each of said regions corresponding to a select one of said bands, wherein each of said filters has a bandpass transmission characteristic which varies as a function of the corresponding correction signal.

3. An equalizing system in accordance with claim 2, wherein each of said filters includes means for varying the signal gain within the passband region of said filter responsively to and as a function of said correction signal.

4. An equalizing system in accordance with claim 3, wherein each said filter provides unity gain for signal energy outside its passband.

5. An equalizing system in accordance with claim 4, wherein said plurality of filters are connected in two parallel arrays, one in series with the other, wherein any two filters having adjacent passbands are disposed in series with one another and any two filters in the same parallel array provide outputs having substantially no interaction with one another.

6. An equalizing system in accordance with claim 3, wherein each of said correction signals in a digital signal and said means for varying the signal gain within said passband region comprises a multiplying digital to analog converter having a digital input for receiving said correction signal and an analog input for receiving the signal energy within the passband of the filter, and an output for a first output signal as a function of the product of the signal energy at said analog input and the digital value of the correction signal at said digital input.

7. An equalizing system according to claim 6, wherein said filter further includes means for providing a second output signal representative of the portion of said input electrical signal above said passband at unity gain, means for providing a third output signal representative of the lowpass portions of the input electrical signal at unity gain, and means for summing said first, second and third output signals.

8. An equalizing system according to claim 1, wherein said detection means comprises a microphone.

9. An equalizing system according to claim 8, wherein said detection means further comprises gain control means coupled to the output of said microphone for controlling the signal gain of the output of said microphone.

10. An equalizing system in accordance with claim 9, wherein said gain control means comprises a multiplying digital to analog converter having a digital input for receiving digital gain control signals, an analog input for receiving the output of said microphone, and an output for providing an electrical signal as a function of the product of the signal energy at the analog input and the digital gain control signal.

11. An equalizing system according to claim 1, wherein said detection means is capable of detecting the output of said loudspeaker system at each of a multiplicity of positions within said environment; said means for comparing the signal energy content includes (1) means for generating for each said frequency band a like multiple of said correction signals corresponding to the multiple positions, and (2) means for averaging for each said frequency band said multiple of said correction signals and providing an average correction signal for said band; and wherein said modification means is responsive to each said average correction signal.

12. An equalizing system in accordance with claim 1 wherein said first means comprises first filter means for providing a first output signal representative of the signal energy of the first electrical signal within each said frequency band; said second means comprises second filter means for providing a second output signal representative of the signal energy of the input electrical signal within each said frequency band, and said means for comparing includes means for comparing said first and second output signals and for generating said correction signals responsively to said comparison.

13. An equalizing system in accordance with claim 12, wherein said first and second filter means each include bandpass filter means for providing a filtered output signal representative of signal energy within each frequency band of the respective first and input electrical signals, and level sensing means for providing the respective first and second output signals as a function of the amplitudes of the corresponding filtered output signals for each said band.

14. An equalizing system in accordance with claim 13, wherein said level sensing means comprises a detector for detecting said filtered output signal on an RMS basis.

15. An equalizing system in accordance with claim 13, wherein said bandpass filter means of each of said first and second filter means comprises (1) a plurality of bandpass filters each corresponding to a select one of said frequency bands, (2) a plurality of said level sensing means for providing the corresponding one of said first and second output signals for each of said frequency bands, and (3) multiplexing means for selectively providing for a selected frequency band said corresponding one of said first and second output signals.

16. An equalizing system in accordance with claim 15 wherein said multiplexing means is digitally controlled.

17. An equalizing system in accordance with claim 13, wherein said bandpass filter means comprises a bandpass filter having a bandpass region selectively controlled by a select one of a plurality of control signals corresponding to said plurality of frequency bands and means for generating each of said control signals.

18. An equalizing system in accordance with claim 17, wherein said bandpass filter provides an output signal for each of said plurality of said bandpass regions responsively to each of said control signals.

19. An equalizing system in accordance with claim 18, wherein said bandpass filter comprises two integrating amplifiers and means for modifying the integrating time constants of said amplifiers responsively to one of said control signals so as to provide a select one of the bandpass regions.

20. An equalizing system in accordance with claim 19, wherein said means for modifying said integrating time constants includes a voltage control amplifier coupled to the input of each of said integrating amplifiers and responsive to each of said control signals.

21. An equalizing system in accordance with claim 20, wherein said means for generating each of said control signals comprises means responsive to a digital signal for providing a voltage control signal as a function of said digital signal to each said voltage control amplifier.

22. An equalizing system according to claim 1, further including means for generating said input electrical signal, wherein said input electrical signal is pink noise.

23. An equalizing system according to claim 1, wherein each of said frequency bands has a center frequency at an octave center.

24. An equalizing system according to claim 1, wherein each of said frequency bands has a center frequency at one-third octave center.

25. An equalizing system according to claim 1, wherein said input electrical signal is a program audio signal.

* * * * *

UNITED STATES PATENT AND TRADEMARK OFFICE
CERTIFICATE OF CORRECTION

PATENT NO. : 4316060
DATED : February 16, 1982
INVENTOR(S) : Robert W. Adams & Leslie B. Tyler It is certified that error appears in the above-identified patent and that said Letters Patent are hereby corrected as shown below:

In claim 6, column 13, line 46 after signals, "in" should read "is".

Signed and Sealed this

Twentieth Day of July 1982

[SEAL]

Attest:

GERALD J. MOSSINGHOFF

Attesting Officer     Commissioner of Patents and Trademarks